United States Patent
Okabe et al.

(10) Patent No.: US 6,498,366 B1
(45) Date of Patent: *Dec. 24, 2002

(54) SEMICONDUCTOR DEVICE THAT EXHIBITS DECREASED CONTACT RESISTANCE BETWEEN SUBSTRATE AND DRAIN ELECTRODE

(75) Inventors: Yoshifumi Okabe, Nagoya (JP); Masami Yamaoka, Anjo (JP); Akira Kuroyanagi, Okazaki (JP)

(73) Assignee: Denso Corporation, Kariya (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/962,322

(22) Filed: Oct. 31, 1997

Related U.S. Application Data

(62) Division of application No. 08/409,900, filed on Mar. 22, 1995, now Pat. No. 5,689,130, which is a continuation of application No. 07/953,766, filed on Sep. 30, 1992, now abandoned, which is a division of application No. 07/652,920, filed on Feb. 8, 1991, now Pat. No. 5,242,862.

(30) Foreign Application Priority Data

Feb. 14, 1990 (JP) ............................................... 2-33367

(51) Int. Cl.⁷ .................... H01L 29/76; H01L 29/94; H01L 23/48; H01L 23/52
(52) U.S. Cl. ................ 257/341; 257/342; 257/339; 257/763; 257/766
(58) Field of Search .................... 257/341, 342, 257/337, 763, 766, 770, 339, 734, 739, 618

(56) References Cited

U.S. PATENT DOCUMENTS

| | | | |
|---|---|---|---|
| 4,852,345 A | 8/1989 | Himelick | 437/41 |
| 4,859,629 A | 8/1989 | Reardon et al. | 438/492 |
| 4,879,250 A | 11/1989 | Chan | 438/24 |

(List continued on next page.)

FOREIGN PATENT DOCUMENTS

| | | | |
|---|---|---|---|
| JP | 57-15420 | 1/1982 | 257/565 |
| JP | 57-097630 | 6/1982 | 438/530 |
| JP | 59/189625 | 10/1984 | 257/565 |

(List continued on next page.)

OTHER PUBLICATIONS

Webster's II New Riverside University Dictionary, 1984, P.549.*
Semiconductor devices, physics and technology, by S. M. Sze, P, 38, 1985.*
Wolf et al., "Silicon Processing for the VLSI Era, vol. 1: Process Technology", Lattice Press, 1986, pp. 14–15.*

(List continued on next page.)

Primary Examiner—Steven Loke
(74) Attorney, Agent, or Firm—Harness, Dickey & Pierce, PLC

(57) ABSTRACT

A semiconductor device including an N-type semiconductor substrate which includes arsenic as an impurity, a first electrode formed on a main surface of the N-type semiconductor substrate, a ground surface formed on another surface of the N-type semiconductor substrate, a second electrode formed on the ground surface and ohmically-contacted with the N-type semiconductor substrate, a semiconductor element formed in the N-type semiconductor substrate and flowing current between the first electrode and the second electrode during ON-state thereof. The device has a reduced ON-resistance thereof.

75 Claims, 8 Drawing Sheets

U.S. PATENT DOCUMENTS

| | | | |
|---|---|---|---|
| 4,927,784 A | 5/1990 | Kazior et al. | 438/584 |
| 4,931,412 A | 6/1990 | Fischer et al. | 438/71 |
| 4,985,740 A | 1/1991 | Shenai et al. | 257/341 |
| 5,241,862 A | 9/1993 | Okabe et al. | 73/514.37 |
| 5,338,961 A | 8/1994 | Lidow et al. | 257/342 |
| 5,689,130 A | * 11/1997 | Okabe et al. | 257/342 |

FOREIGN PATENT DOCUMENTS

| | | | |
|---|---|---|---|
| JP | 59-213140 | 12/1984 | 438/106 |
| JP | 59-220937 | 12/1984 | 148/DIG. 138 |
| JP | 59-113629 | 6/1985 | 257/666 |
| JP | 61-234041 | 10/1986 | 257/341 |
| JP | 61-296769 | 12/1986 | 438/158 |
| JP | 62/23170 | 1/1987 | 257/342 |
| JP | 62-43123 | 10/1987 | 257/565 |
| JP | 62-243332 | 10/1987 | 257/565 |
| JP | 62-293678 | 12/1987 | 257/337 |
| JP | 1-169970 | 7/1989 | 257/341 |
| JP | 58-45814 | 10/1993 | 76/24.1 |
| JP | 63-253633 | 10/1998 | 257/104 |

OTHER PUBLICATIONS

Krishna Shenai, "A50–v07–m$\Omega$.cm$^2$ Vertical–Power DMOSFET", IEEE Elect. Device Letter, vol. No. 10, No. 3,/1989.

Krishnam Shenai, "Optimally Scaled Low–Voltage Vertical Power MOSFET's for High–Frenquency Power Conversion", IEEE Trans. of Elect. Device vol. 37 No, 4, Apr. 1990.

C.Y. Ting et al, "The Use of Titanium–based Contact Barrier Layers in Silicon Technology", Thin Solid Films, 96(1982) 327–345 Electronics and Optics.

Semiconductor Devices–Physics and Technology, Jan. 1985 S.M. Sze p. 307.

Alvin B. Phillips, "Transitor Engineering and Introduction to Integrated Semiconductor Circuits", p. 76.

S. Ogawa et al., HRTEM and Nano–Scale Micro Analysis of the Titanum/Silicon Interfacial Reaction Correlated with Electrical Properties, Extended Abstracts of.

K. Shenai et al."Selectively Silicided Vertical Power DMOSFET's for High–Frequency Power Conversion" Electronics Letters, vol. 25, No. 12, 1989, p. 784–785.

K. Shenai et al., "Blanket LPCVD Tungsten Silicide Technology for Smart Power Applications", IEEE Electron Device Letters, vol. 10, No. 6, 1989, p. 270–273.

K. Shenai et al., "High–Performance Vertical–Power DMOSFET's with Selectively Silicided Gate and Source Regions", IEEE Electron Device Letters, vol. 10, No. 4, 1989, p. 153–155.

K. Shenai et al., "Selectively Silicided Vertical Power double–diffused metal–oxide Semiconductor field effect transistors for high–frequency power switching applications", J. Vac. Sci. Technol. B6 (6), 1988, p. 1740–1745.

H.R. Chang et al., "Self–Aligned UMOSFET's with a Specific On–Resistance of 1 m$\Omega$ • cm$^2$", IEEE Transactions on Electron Devices, vol. ED–34, No. 11, 1987, p. 2329–2334.

K. Shenai et al. "Selectively Silicided Vertical Power DMOSFET's for High–Frequency Power Conversion" Electrionics Letters, vol. 25, No. 12, 1989, p. 784–785.

* cited by examiner-

SEMICONDUCTOR DEVICE THAT EXHIBITS DECREASED CONTACT RESISTANCE BETWEEN SUBSTRATE AND DRAIN ELECTRODE

This is a division of application Ser. No. 08/409,900, filed Mar. 22, 1995, now U.S. Pat. No. 5,689,130, which is a continuation of application Ser. No. 07/953,766 filed Sep. 30, 1992, now abandoned, which was a division of application Ser. No. 07/652,920 filed Feb. 8, 1991, which issued as U.S. Pat. No. 5,242,862.

BACKGROUND OF THE INVENTION

1. Field of the Invention

This invention relates to a semiconductor device which has a low ON-resistance, and further, to a method of manufacturing such a semiconductor device.

2. Description of the Related Art

Many kinds of methods of manufacturing for reducing an ON-resistance of a semiconductor device have been known. For example, Japanese Unexamined Patent Publication 1-169970 discloses a method which an N-type impurity layer is formed in a back surface of a drain substrate so as to reduce a contact resistance between the drain substrate and a drain electrode. Japanese Examined Patent Publication 58-45814 discloses a method of manufacturing the semiconductor device which has a good ohmic contact between the drain substrate and the drain electrode. The device has a multilayer metal electrode on a back surface of a drain substrate. The multilayer metal electrode consists of layers having a gold layer as a main layer.

As shown in FIG. 13, the ON-resistance of a field effect transistor (FET) is represented by the following equation:

$$R_{ON}=R1+R2+R3+R4+R5+R6+R7+R8+R9+R10$$

wherein, R1 denotes a contact resistance of a drain electrode 50; R2 denotes a contact resistance between the drain electrode 50 and an N-Type impurity layer 52; R3 denotes a resistance of N drain substrate 54; R4, R5 and R6 denote resistances of N drain region 56 respectively; R7 denotes a resistance of P-Type diffusion region 58 for forming a channel; R8 denotes a resistance of N-type source 60; R9 denotes a contact resistance between the N-Type source 60 and a source electrode 62; and R10 denotes a resistance of the source electrode 62.

However, such a conventional method of manufacturing the semiconductor device has many problems. For example, the method by which the N-Type impurity layer is formed is complex because an oxide film adhered to the back surface of the N drain substrate 54 and a diffusion layer having an opposite conductive type (P) to that of the N drain substrate 54 must be removed before the N-type impurity layer 52 is formed.

A semiconductor device for household use is demanded with a withstanding voltage more than 100V, normally more than 200V. It is a necessary to make a resistance of a epitaxial layer (the N drain region 56) formed on the N drain substrate 54 high to get the withstanding voltage. Therefore, the ratio of the resistance of the N drain substrate 54 to the resistance of the epitaxial layer becomes small. On the contrary, a semiconductor device for a motor vehicle is demanded with a withstanding voltage of at most 50–60V. The resistance of the epitaxial layer is relatively low, and the ratio of the resistance of N drain substrate 54 to the resistance of the epitaxial layer becomes large. Therefore, in the semiconductor device for a motor vehicle, it is effective to reduce the resistance of the N drain substrate 54 for reducing the ON-resistance.

The resistance R3 of the N drain substrate 54 is represented by the following equation:

$$R3=\rho_N \times t_n/S$$

wherein, $\rho_N$ denotes resistivity of the N drain substrate 54; $t_n$ denotes a thickness of the N drain substrate 54; and S denotes a cross section of the N drain substrate 54. It is necessary to reduce the thickness $t_n$ of the N drain substrate 54 so as to reduce this resistance R3. However, the thickness $t_n$ of the N drain substrate 54 for forming the N-Type impurity layer 52 is determined in accordance with a thickness of a silicon wafer. The reason is that the N drain substrate 54 is warped by heat generated in a step that the N-Type impurity layer 52 is formed when the thickness $t_n$ of the N drain substrate 54 is too thin. To get a wafer of large diameter, the thickness $t_n$ needs to be thick to keep the strength thereof. Therefore, the resistance R3 of the N drain substrate 54 becomes high, and thus the ON-resistance also becomes high.

The technique by which the concentration of antimony (Sb) as a impurity in the N drain substrate 54 is heightened and the resistivity is diminished, may be adopted so as to reduce the resistance R3 of the N drain substrate 54. However, it is impossible to make the resistance R3 less than 0.01 Ω·cm because of the limitation of the amount solution of Sb which can be in the solution.

Moreover, since it is impossible to make the impurity concentration in the substrate high because of the limitation of solution, it is difficult to get a good ohmic contact between an N-type substrate and an electrode.

On the other hand, in the method which utilizes gold as an electrode material, the barrier height of the gold for an P-type silicon substrate is 0.2 eV, and therefore so a good ohmic contact between those can be obtained. However, since the barrier height of the gold for an N-type silicon substrate is relatively high, 0.8 eV, the contact between those becomes a schottky contact and may have undesirable diode character.

Moreover, when an overall thickness is thick, stress from a package and a step between a lead frame and the source electrode 62 becomes higher. Therefore, the wire bonding work becomes very difficult. Also, the cost of gold is very high.

Techniques other than the aforementioned techniques have also been known. The technique which is disclosed in Japanese Unexamined Patent Publication 57-15420 suggests that a back surface of a silicon substrate is ground to improve adherence between the back surface and a collector electrode formed on the back surface. The technique which is disclosed in "IEEE ELECTRON DEVICE LETTERS, VOL. 10, NO. Mar. 3 1989, P101–103" suggests that a 0.004 Ω·cm arsenic-doped silicon substrate is used.

SUMMARY OF THE INVENTION

An object of this invention is to reduce the ON-resistance of a semiconductor device.

Another object of this invention is to get a good ohmic contact.

A still further object of this invention is to provide a thin semiconductor device having the advantage of small stress from a package and easy wire bonding.

To accomplish the above objects, a semiconductor device according to this invention includes an N-type semiconductor substrate including arsenic as an impurity and having a ground surface formed on one surface thereof, said ground surface having concavo-convex irregularities, a first electrode formed on another surface other than said one surface of said N-type semiconductor substrate, a second electrode formed on said ground surface and ohmically contacted with said N-type semiconductor substrate through said ground surface, and a semiconductor element formed in said N-type semiconductor substrate and in which an electric current flows between said first electrode and said second electrode during an ON-state thereof.

DESCRIPTION OF THE PREFERRED EMBODIMENTS

The preferred embodiments of this invention will be described with reference to the drawings. The embodiments are suitable for a semiconductor device for a motor vehicle.

Figure 1:
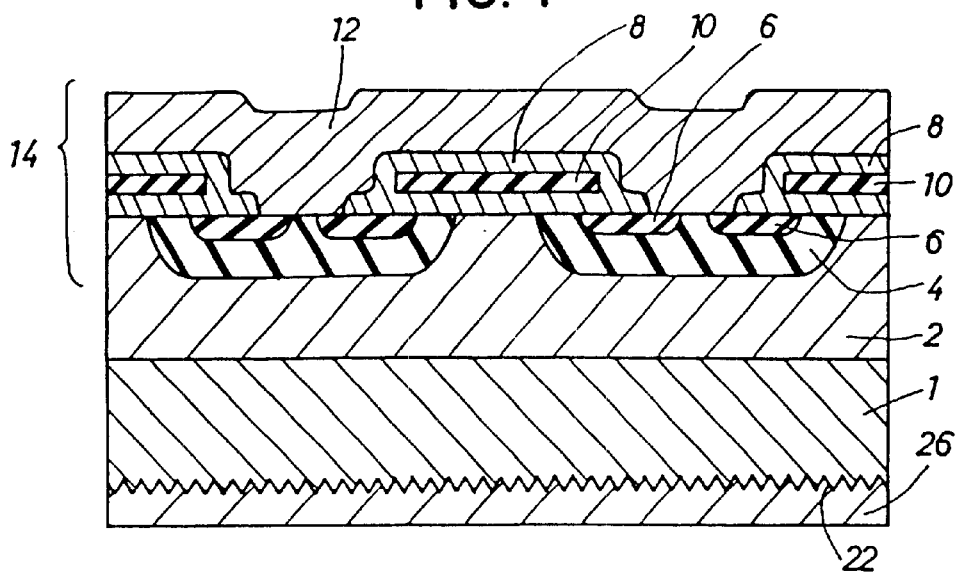
FIG. 1 is a sectional view of a semiconductor device of this invention.

FIG. 1 shows an N-type drain region 2 formed on a silicon substrate 1 which is doped with As (arsenic) formed by crystallizing melted silicon that has As therein. A P-type region 4 is formed in the N-type drain region 2 for forming a channel. An N-type source region 6 is formed in the P-type region 4. A polycrystalline silicon gate 10 is formed on the N-type drain region 2 and the P-type region 4 through an oxide film ($SiO_2$) 8. A source electrode 12 is formed on the oxide film 8 and electrically connected with the P-type region 4 and the N-type source region 6. An ohmic electrode 26 is formed on a ground surface 22 which is formed on a back surface of the silicon substrate 1.

Here, the prior art used Sb (antimony) as an N-type impurity. However, the concentration of Sb could not be more than $5 \times 10^{18}$ $cm^{-3}$ owing to its limitation of solution. The inventors have solved this problem by including As in the silicon substrate 1 as the N-type impurity. As has a higher limitation of solution than Sb and therefore solves this problem. The concentration of As is set within a range between $7 \times 10^{18}$ $cm^{-3}$ and $1 \times 10^{21}$ $cm^{-3}$. Therefore, the contact resistance between the silicon substrate 1 and the ohmic electrode 26 can be reduced sufficient to avoid a schottky contact and get an ohmic contact. Since the concentration of As is more than $7 \times 10^{18}$ $cm^{-3}$, a good ohmic contact can be obtained for almost all electrode materials. Moreover, the resistivity of the silicon substrate 1 is also diminished because of the higher concentration of As included in the silicon substrate 1 as an impurity. Consequently, the resistance R3 of the silicon substrate 1 is also reduced. The ground surface 22 has been ground to have a concavo-convex surface which has many coarse surface irregularities. Therefore, the ohmic electrode 26 can be firmly adhered to the ground surface 22 because the ground surface 22 has a suitable concavo-convex surface.

Figure 2A:
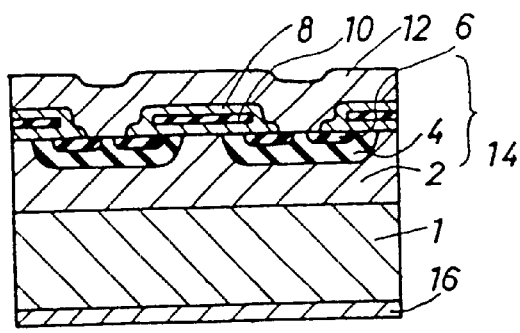
FIGS. 2A–2C are sectional views showing the sequence of processes of the semiconductor device of this of this invention.
Figure 2B:
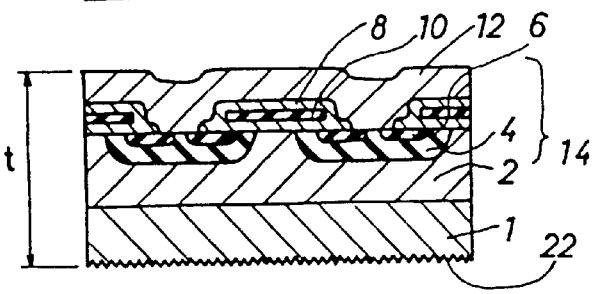
Figure 2C:
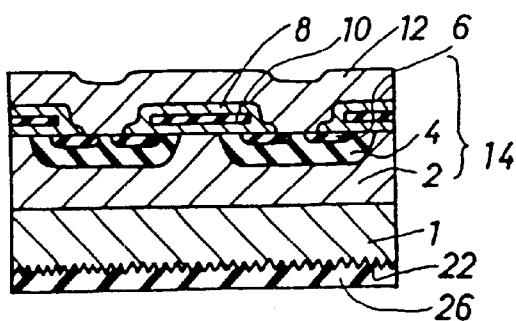

The process of forming the aforementioned semiconductor device of the embodiment of this invention will now be described with reference to FIGS. 2A–2C. FIGS. 2A–2C show the sequence of the process. A silicon crystal is formed by a CZ (Czochralski) method, where As is added as a dopant in a melted silicon. The silicon substrate 1 is formed by slicing the silicon crystal. Therefore the silicon substrate 1 has As a solid solution, the concentration of As being in the range between approximately $7 \times 10^{18}$ $cm^{-3}$ and $1 \times 10^{21}$ $cm^{-3}$, and resistivity of the silicon wafer is less than 0.008 $\Omega \cdot cm$. FIG. 2A shows the N-type drain region 2 having P (phosphorus) as an impurity and being grown on a main surface of the silicon substrate 1 by an epitaxial growth method. The oxide film ($SiO_2$) 8 is formed on a surface of the N-type drain region 2. The polycrystalline silicon is deposited on the oxide film 8 by an LPCVD (low pressure chemical vapor deposition) technique. P (phosphorus) is introduced in the polycrystalline silicon, and the polycrystalline silicon is locally etched to form the polycrystalline silicon gate 10. The polycrystalline silicon gate 10 is oxidized, and P-type impurities such as B (boron), Al (aluminium), Ga (gallium) or the like are diffused into the N-type drain region 2 by using this polycrystalline silicon gate 10 as a mask for forming the P-type region 4. A portion of the P-type region 4 becomes a channel region. The N-type source region 6 is formed by locally diffusing N-type impurities such as As, P (phosphorus) or the like into the P-type region 4. Windows are then opened in the oxide film 8 and Al—Si is deposited by a sputtering method for forming the source electrode 12, so that the source electrode 12 is connected to both the P-type region 4 and the N-type source region 6. Here, a device layer 14 consists of the P-type region 4, the N-type source region 6, the oxide film 8, the polycrystalline silicon gate 10, and the source electrode 12. Moreover, a passivation film such as a plasma-SiN or the like may be formed on the source electrode 12 for stabilizing a surface of the device layer 14.

Figure 3:
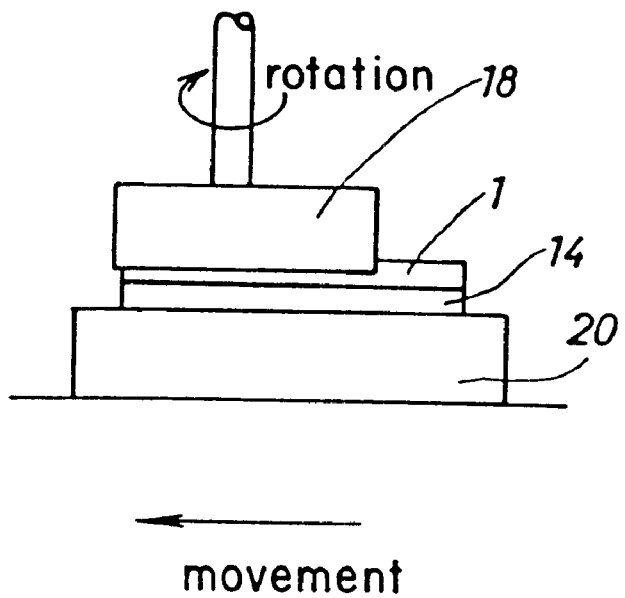
FIG. 3 is a side view for explaining a surface grinding proceeding.

During this process, a by-product layer 16, such as a polycrystalline silicon, a silicon oxide ($SiO_2$) or the like, is spontaneously formed on another (back) surface of the silicon substrate 1 while the aforementioned device is being manufactured. The another surface of the silicon substrate 1 on which the by-product layer 16 is formed thereon is ground by a surface grinding (SG) proceeding for removing the by-product layer 16. The surface grinding is carried out by using a grindstone 18 as shown in FIG. 3. The granularity of the grindstone 18 is between No. 300–No. 500. In this embodiment, a surface of the device layer 14 is covered with a adhesive film (not shown) and the device layer 14 is fixed by a vacuum chuck 20.

FIG. 2B shows the by-product layer 16 removed by the grinding, and a ground surface 22 being formed. In this condition, the thickness t from one surface of the device layer 14 to the another surface of the silicon substrate 1 is 200–450 μm. After grinding, the whole device is washed by super pure water.

Figure 5:
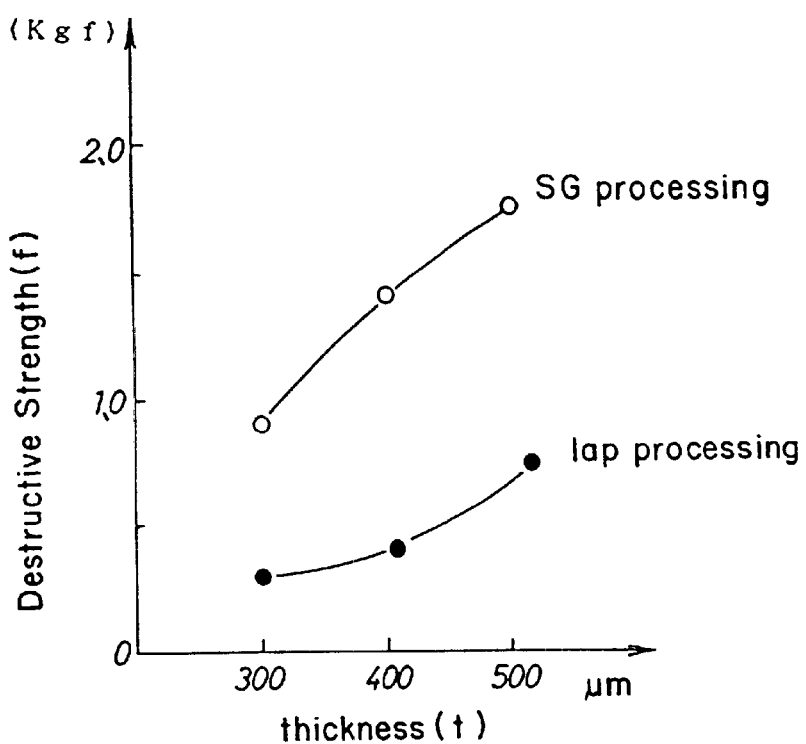
FIG. 5 shows a relationship between the thickness t and destructive strength.
Figure 6:
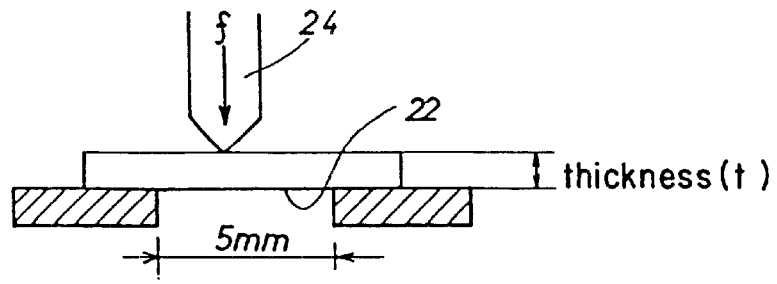
FIG. 6 is a sectional view for explaining a load test.

The silicon crystal of the another surface of the silicon substrate 1 is damaged by the grinding. This damage destroys some part of the crystalline structure of the silicon substrate, and should therefore be avoided. It also decreases the destruction strength. However, the depth of this damaged layer is only 1–2 μm if the surface grinding device of FIG. 3 is used. FIG. 5 shows a graph of depth of the damaged layer. Because the depth of the damaged layer is shallow, the destruction strength of this device is still between 1.0–1.6 kg. FIG. 6 shows a load test where the destruction strength is defined as a maximum load when a chip destroyed. The load test is carried out in such a way that the center of the chip is supported at its both ends and has a load applied thereon by a load piece 24.

Figure 4:
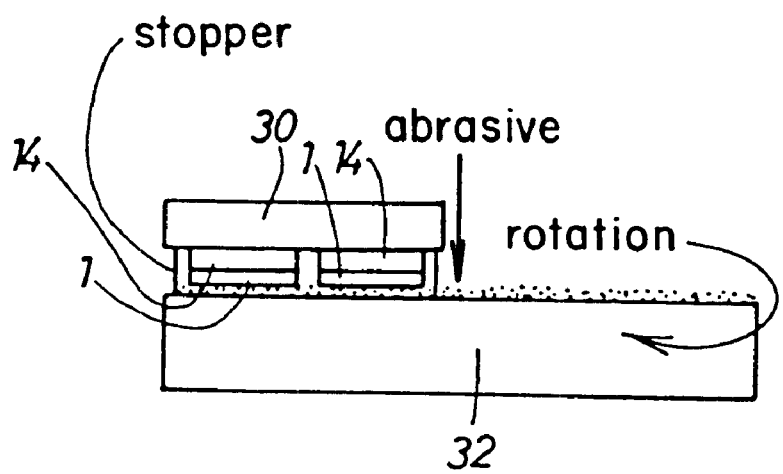
FIG. 4 is a side view for explaining a lapping grinding proceeding.

If the another surface of the silicon substrate 1 is ground by lapping grinding instead of surface grinding, the depth of the damaged layer is 6–7 μm, and the destruction strength of this device becomes 0.3–0.6 kg (shown in FIG. 5). FIG. 4 shows the lapping grinding is carried out in the condition which the device is fixed on upper surface plate 30 by paraffin glue and abrasives (a mix of abrasives No. 800 and No. 1200 of SiC) are supplied between the device and a lower surface plate 32. As understood by comparing the two lines in FIG. 5, surface grinding will make the destruction strength stronger than lapping grinding.

Figure 7:
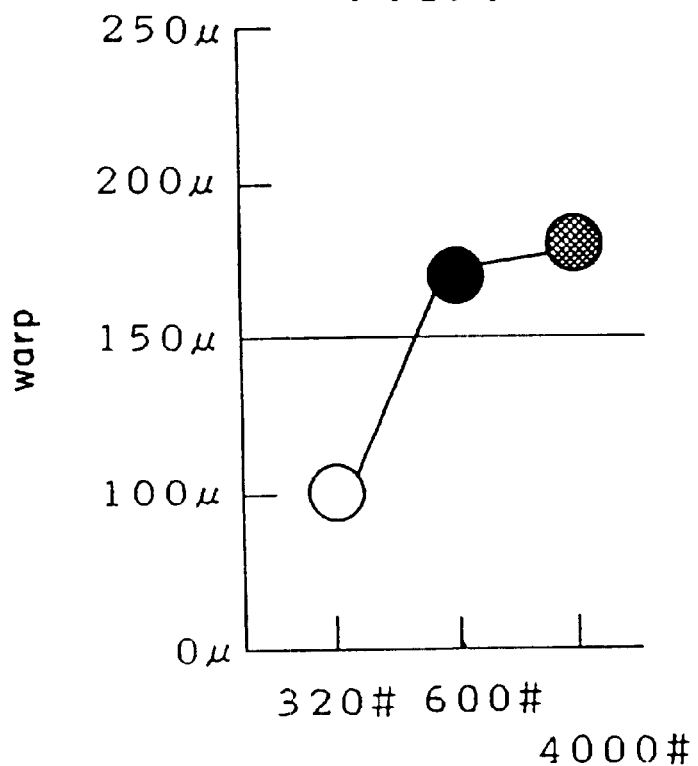
FIG. 7 shows a relationship between the granularity of a grindstone and warp of the silicon substrate.

FIG. 7 shows that when the granularity of the grindstone 18 is No. 300–No. 500, the warping of the silicon substrate 1 can be reduced. If the granularity is finer than No. 500, however the warp becomes larger. If the granularity is coarser than No. 300, the possibility which of breaking of the silicon substrate 1 is increased.

The reason why the warping is reduce is that the coarser the granularity is, the more stress in the silicon substrate is dispersed.

Figure 14:
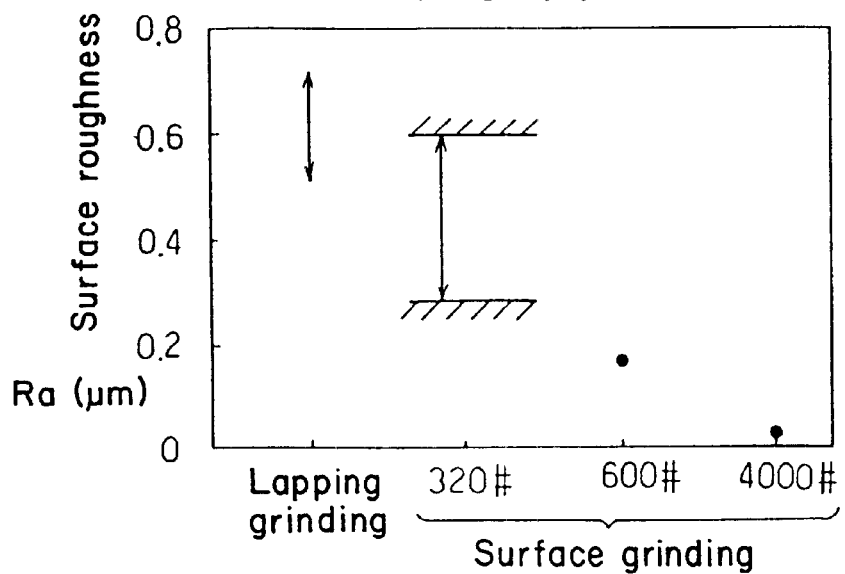
FIG. 14 shows a relationship between the granularity and surface roughness.

FIG. 14 shows a relationship between the granularity of the grindstone 18 and surface roughness Ra. When the granularity is No. 320, the surface roughness Ra is in a range between 0.3–0.6 μm. When the granularity is No. 600, the surface roughness Ra is almost 0.2 μm. When the granularity is No. 4000, the surface roughness Ra becomes almost 0 μm. It is to be noted that surface roughness Ra of the silicon substrate 1 which is polished up is also almost 0 μm.

Figure 15:
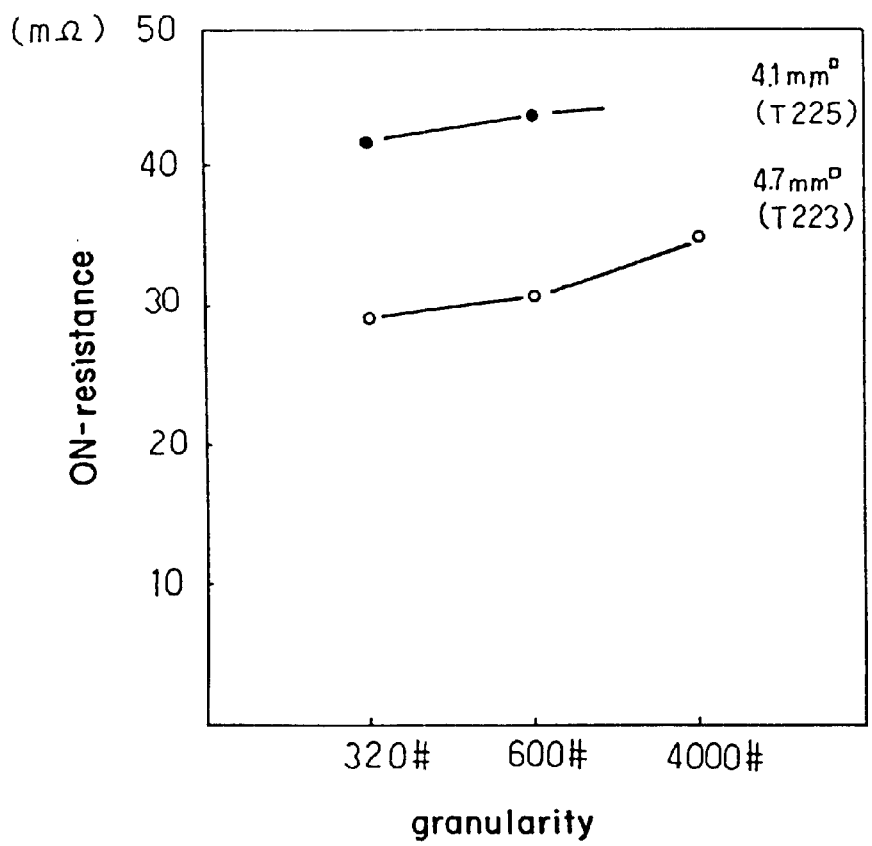
FIG. 15 shows a relationship between the granularity and an ON-resistance.

FIG. 15 shows a relationship between the granularity of the grindstone 18 and an ON-resistance. As shown in FIG. 15, when the granularity is coarser, the ON-resistance becomes low. The reason is that when the granularity is coarser, barrier height of the ohmic electrode 26 for the silicon substrate 1 becomes high, and the contact resistance between the ohmic electrode 26 and the silicon substrate 1. It is desirable that the granularity is a range between No. 320–No. 600 to reduce the ON-resistance.

Figure 8:
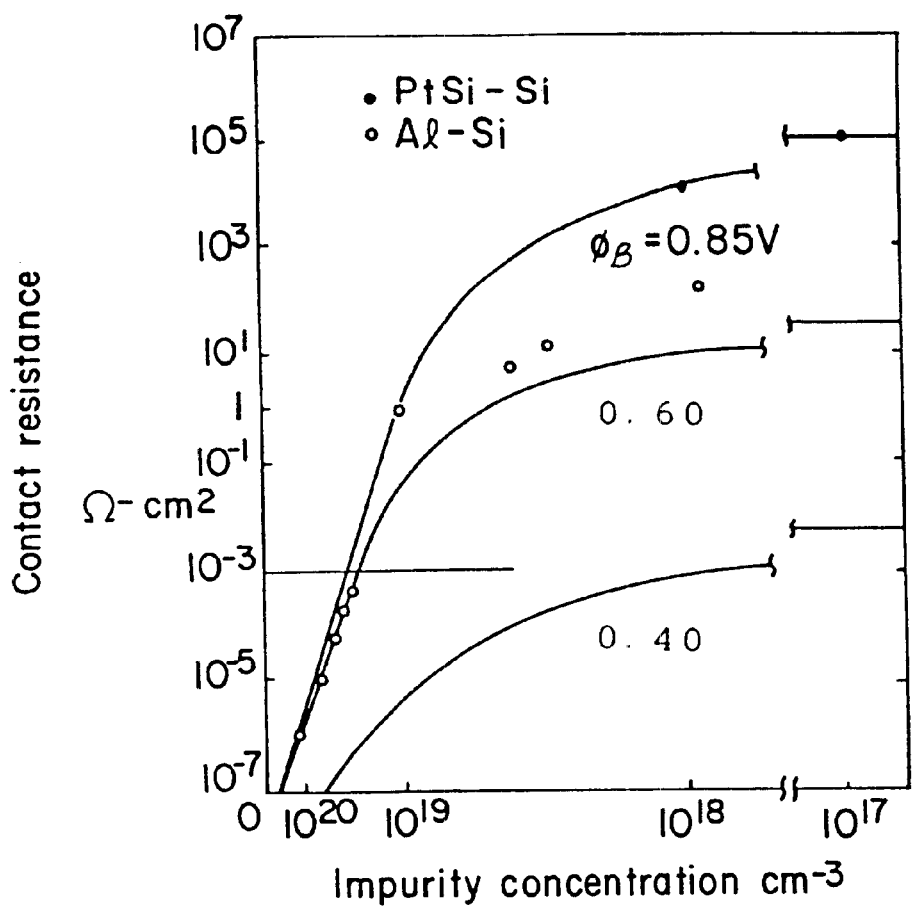
FIG. 8 shows a relationship between the impurity concentration and the contact resistance.
Figure 13:
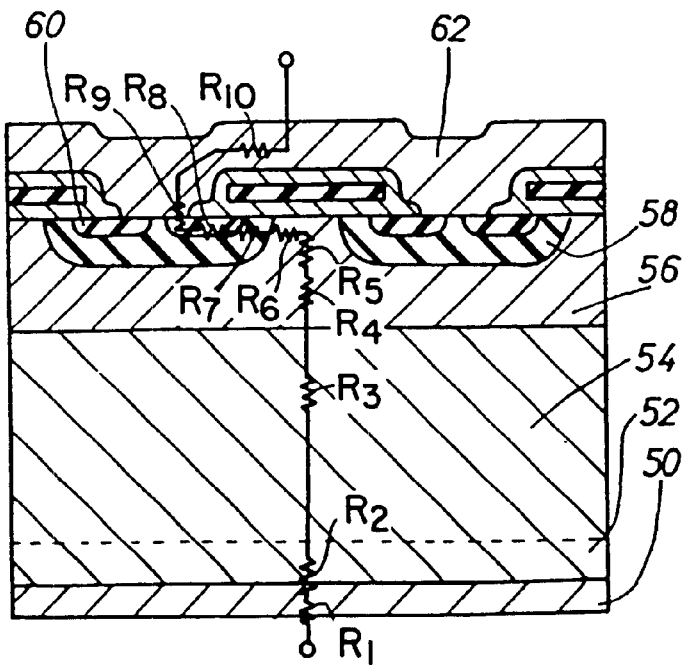
FIG. 13 is a sectional view of a semiconductor device of the prior art.

FIG. 2C shows that after the spontaneously formed by product layer 16 (not shown) has been removed by a wet etching or an RF etching, and an ohmic electrode 26 is formed on the ground surface 22 by a sputtering method. The ohmic electrode 26 acts as a drain electrode. In this embodiment, the ohmic electrode 26 is a multilayer electrode consisting of Ti—Ni—Au layers. When electrode material, such as Ti (titanium), V (vanadium), Cr (chromium), Ni (nickel) or the like, is adopted, it is necessary to make an impurity concentration in the silicon substrate 1 more than $5 \times 10^{18}$ cm$^{-3}$, preferably, more than $7 \times 10^{18}$ cm$^{-3}$ so as to make an ohmic contact with the electrode material. The barrier height $\Phi_B$ of the electrode material for silicon is 0.4–0.6 eV. As shown in FIG. 8, if the impurity concentration is more than $5 \times 10^{18}$ cm$^{-3}$, the contact resistance between the electrode material and the silicon substrate 1 begins to rapidly be reduced, and if the impurity concentration is more than $7 \times 10^{18}$ cm$^{-3}$, the contact resistance becomes less than $10^{-3}$ Ω·cm$^2$.

Figure 9:
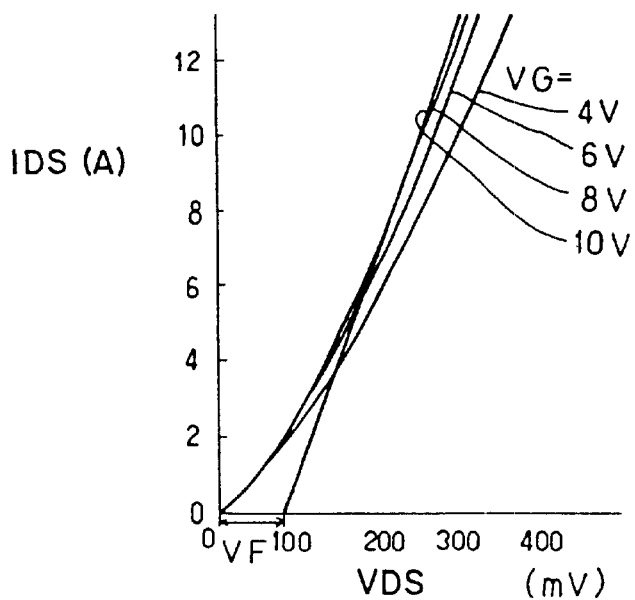
FIG. 9 shows a relationship between $V_{DS}$ and $I_{DS}$ of power MOSFET.

FIG. 9 shows a relationship between $V_{DS}$ (voltage between the source and the drain) and $I_{DS}$ (current between the source and drain) of this power MOSFET. Voltage of the gate $V_G$ is a parameter shown in Figure as being used as an index so as to judge whether the contact is a schottky contact.

Figure 10:
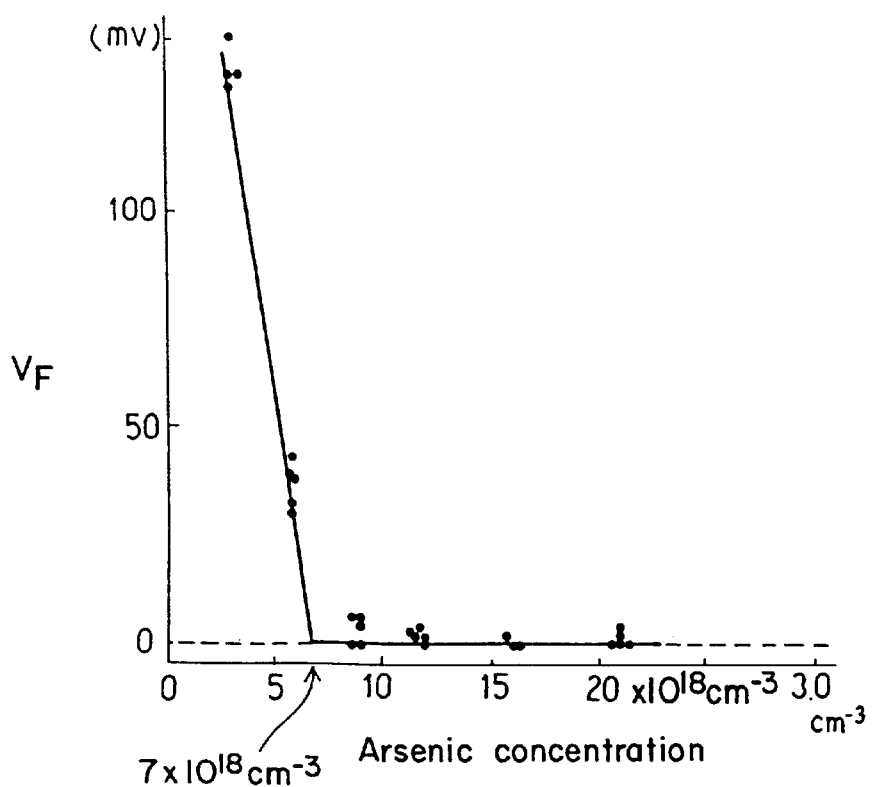
FIG. 10 shows a relationship between $V_F$ and the concentration of As in the silicon substrate.

FIG. 10 shows a relationship between this calculated $V_F$ and a concentration of As in the silicon substrate 1. As shown in FIG. 10, when the concentration of As is more than $7 \times 10^{18}$ cm$^{-3}$, $V_F$ becomes substantially 0 (zero) and the contact is an ohmic contact.

The upper limitation of the concentration of As which is included in the silicon substrate 1 is its limitation of solution. This limitation is found by measuring the value of leakage current through the P-N junction.

Figure 11:
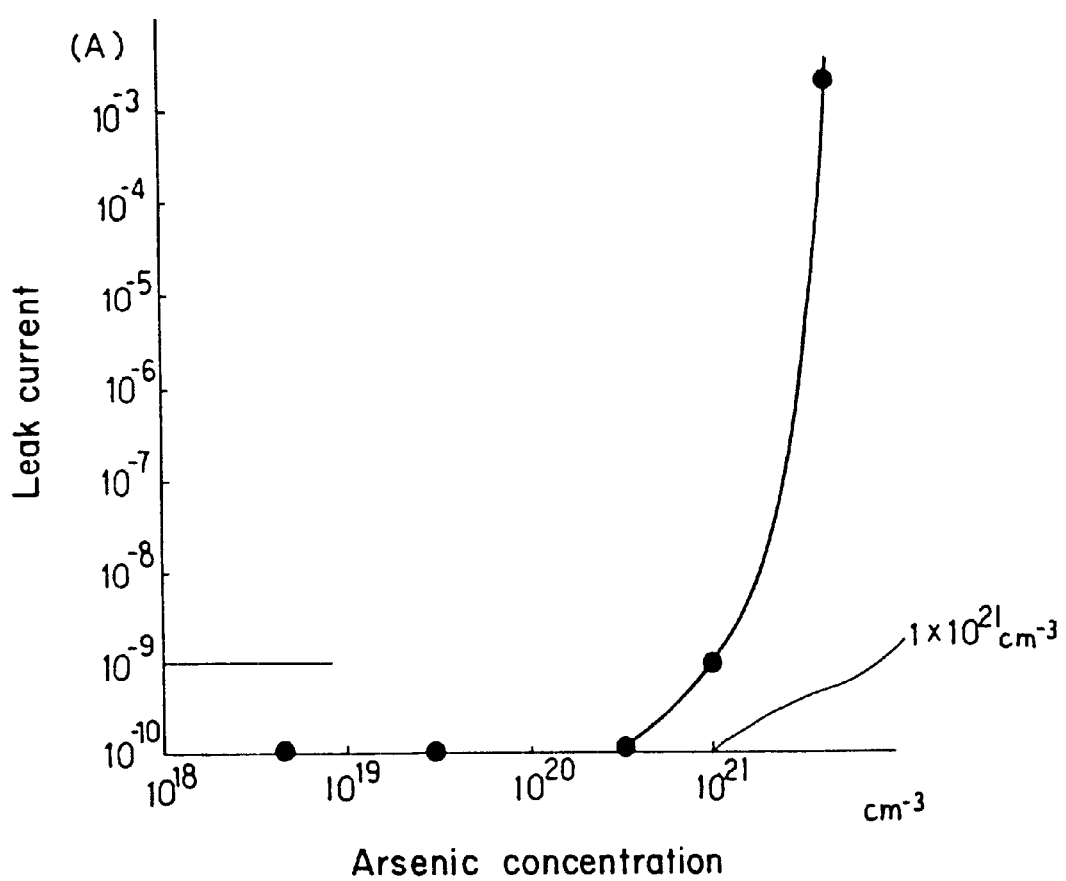
FIG. 11 shows a relationship between the concentration of As and the value of the leak current.

FIG. 11 shows a relationship between the concentration of As and the value of the leakage current through the P-N junction. Before the value of the leakage current is measured, to form P-N junction, a P-type impurity such as B(boron) or the like is diffused in an N-type silicon substrate including As as an impurity. When the concentration of As is higher than its limitation of solution, the crystallinity of silicon is disordered and leakage current flows through the P-N junction. Therefore, the concentration when the leakage current begins to flow is defined as the value of its limitation of solution. As shown in FIG. 11, the limitation of solution is $1 \times 10^{21}$ cm$^{-3}$.

Figure 12:
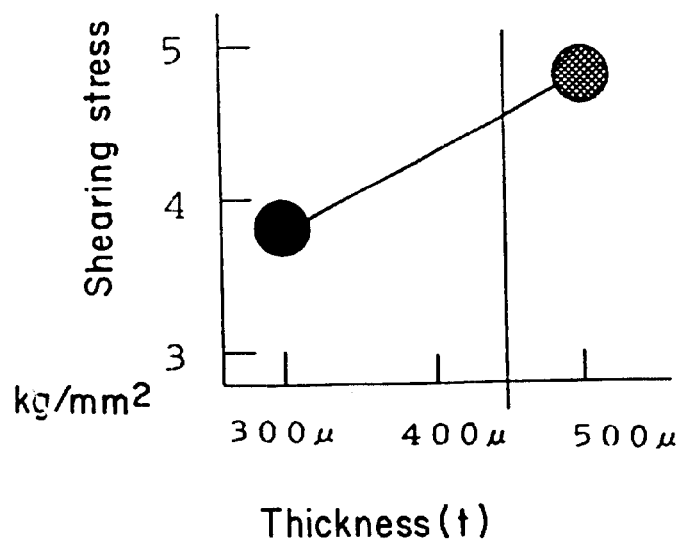
FIG. 12 shows a relationship between the thickness t and shearing stress.

The chip which was manufactured by abovementioned manufacturing steps is molded by silicone resin, and an IC package is formed. In this molding step, because a thickness of the chip is thin, as shown in FIG. 12, the shearing stress becomes low. Consequently, the stress of the IC package is relaxed. Moreover, when a lead frame (not shown) is bonded to the source electrode 12 with a wire, the wire-bonding work becomes easy because the height of the lead frame and the source electrode 12 are similar and therefore these makes a low step.

The present invention has been described with reference to the abovementioned embodiment, but the present invention is not limited to this embodiment and can be modified without departing from the spirit or concept of the present invention. For example, the present invention may be applied to an IGBT (Insulated Gate Bipolar Transistor), SIT (Static Induction Transistor), SI (State Induction) thyristor or the like other than the power MOSFET. These semiconductor elements flow current in a vertical direction (a direction of a thickness of a substrate) and an electrode formed on N-type silicon substrate.

What is claimed is:

1. A semiconductor device comprising:
    a semiconductor substrate with an arsenic as an impurity and a first conductive type layer formed on said semiconductor substrate, said semiconductor substrate having a rough surface opposite said first conductive type layer;

a MOS structure formed in the first conductive type layer, having a second conductive type region, a channel region provided in the second conductive type region to be a first conductive type channel by a gate electrode formed on the second conductive type region;

a first metal electrode contacting said second conductive type region;

a second metal electrode directly contacting said rough surface of said semiconductor substrate, said rough surface having an impurity concentration, the impurity concentration being substantially provided with an arsenic concentration inherent in the semiconductor substrate, whereby an electric current flows in said MOS structure in a direction of a thickness of said semiconductor substrate between said first and second metal electrodes, wherein said rough surface is free from ion implantation, whereby the impurity concentration of the rough surface is substantially provided with said arsenic concentration inherent in the semiconductor substrate.

2. A semiconductor device according to claim 1, wherein said arsenic concentration in the semiconductor substrate is in a range approximately between $7 \times 10^{18}$ and $1 \times 10^{21}$ cm$^{-3}$.

3. A semiconductor device according to claim 2, wherein said first conductivity type layer is a N-type impurity layer, and said second conductive type region is a P-type impurity region.

4. A semiconductor device according to claim 1, wherein said semiconductor substrate has a resistivity of less than 0.008 ohm·cm.

5. A semiconductor device according to claim 1, wherein said second metal electrode comprises a metal layer composed of at least one material selected from a group consisting of titanium (Ti), vanadium (V), chromium (Cr) and nickel (Ni).

6. A semiconductor device according to claim 1, wherein a thickness from a surface of said first metal electrode to said rough surface of said semiconductor substrate is 200–450 microns.

7. A semiconductor device according to claim 1, wherein said first metal electrode is a source electrode of said MOS structure, and said second metal electrode is a drain electrode of said MOS structure.

8. A semiconductor device according to claim 7, wherein said drain electrode comprises a multilayer electrode comprising Ti—Ni—Au.

9. A semiconductor device according to claim 1, wherein said rough surface of said semiconductor substrate has a surface roughness of between 0.2–0.6 microns.

10. A semiconductor device according to claim 1, wherein said rough surface of said semiconductor substrate has a surface roughness of between 0.3–0.6 microns.

11. A semiconductor device comprising:

a semiconductor substrate with an arsenic as an impurity and a first conductive type layer formed on said semiconductor substrate, said semiconductor substrate having a rough surface opposite said first conductive type layer;

a MOS structure formed in the first conductive type layer, having a second conductive type region, a channel region provided in the second conductive type region to be a first conductive type channel by a gate electrode formed on the second conductive type region;

a first metal electrode contacting said second conductive type region;

a second metal electrode directly contacting said rough surface of said semiconductor substrate, said rough surface having an impurity concentration, the impurity concentration being due substantially to an arsenic concentration inherent in the semiconductor substrate, whereby an electric current flows in said MOS structure in a direction of a thickness of said semiconductor substrate between said first and second metal electrodes, wherein said rough surface is free from ion implantation, whereby the impurity concentration of the rough surface is due substantially to said arsenic concentration inherent in the semiconductor substrate.

12. A semiconductor device according to claim 11, wherein said arsenic concentration in the semiconductor substrate is in a range approximately between $7 \times 10^{18}$ and $1 \times 10^{21}$ cm$^{-3}$.

13. A semiconductor device according to claim 12, wherein said first conductive type layer is an N-type impurity layer, and said second conductive type region is a P-type impurity region.

14. A semiconductor device according to claim 11, wherein said semiconductor substrate has a resistivity of less than 0.008 ohm·cm.

15. A semiconductor device according to claim 11, wherein said second metal electrode comprises a metal layer composed of at least one material selected from a group consisting of titanium (Ti), vanadium (V), chromium (Cr) and nickel (Ni).

16. A semiconductor device according to claim 11, wherein a thickness from a surface of said first metal electrode to said rough surface of said semiconductor substrate is 200–450 microns.

17. A semiconductor device according to claim 11, wherein said first metal electrode is a source electrode of said MOS structure, and said second metal electrode is a drain electrode of said MOS structure.

18. A semiconductor device according to claim 11, wherein said drain electrode comprises a multilayer electrode comprising Ti—Ni—Au.

19. A semiconductor device according to claim 11, wherein said rough surface of said semiconductor substrate has a surface roughness of between 0.2–0.6 microns.

20. A semiconductor device according to claim 11, wherein said rough surface of said semiconductor substrate has a surface roughness of between 0.3–0.6 microns.

21. A semiconductor device comprising:

a semiconductor substrate with an arsenic as an impurity and a first conductive type layer formed on said semiconductor substrate, said semiconductor substrate having a rough surface opposite said first conductive type layer;

a MOS structure formed in the first conductive type layer, having a second conductive type region, a channel region provided in the second conductive type region to be a first conductive type channel by a gate electrode formed on the second conductive type region;

a first metal electrode contacting said second conductive type region;

a second metal electrode directly contacting said rough surface of said semiconductor substrate, said rough surface having an impurity concentration, the impurity concentration being substantially provided only with an arsenic concentration inherent in the semiconductor substrate, whereby an electric current flows in said MOS structure in a direction of a thickness of said semiconductor substrate between said first and second metal electrodes.

22. A semiconductor device according to claim 21, wherein said arsenic concentration in the semiconductor substrate is in a range approximately between $7 \times 10^{18}$ and $1 \times 10^{21}$ cm$^{-3}$.

23. A semiconductor device according to claim 22, wherein said first conductive type layer is an N-type impurity layer, and said second conductive type region is a P-type impurity region.

24. A semiconductor device according to claim 21, wherein said semiconductor substrate has a resistivity of less than 0.008 ohm·cm.

25. A semiconductor device according to claim 21, wherein said second metal electrode comprises a metal layer composed of at least one material selected from a group consisting of titanium (Ti), vanadium (V), chromium (Cr) and nickel (Ni).

26. A semiconductor device according to claim 21, wherein a thickness from a surface of said first metal electrode to said rough surface of said semiconductor substrate is 200–450 microns.

27. A semiconductor device according to claim 21, wherein said first metal electrode is a source electrode of said MOS structure, and said second metal electrode is a drain electrode of said MOS structure.

28. A semiconductor device according to claim 27, wherein said drain electrode comprises a multilayer electrode comprising Ti—Ni—Au.

29. A semiconductor device according to claim 21, wherein said rough surface of said semiconductor substrate has a surface roughness of between 0.2–0.6 microns.

30. A semiconductor device according to claim 21, wherein said rough surface of said semiconductor substrate has a surface roughness of between 0.3–0.6 microns.

31. A semiconductor device according to claim 21, wherein said rough surface being free from ion implantation, whereby the impurity concentration of the rough surface being substantially provided only with said arsenic concentration inherent in the semiconductor substrate.

32. A semiconductor device comprising:
    an N-type semiconductor wafer having an N-type silicon substrate with an arsenic concentration approximately between $7 \times 10^{18}$ and $1 \times 10^{21}$ cm$^{-3}$ and an N-type silicon epitaxial layer grown on said N-type silicon substrate, said N-type silicon substrate having a rough surface opposite said N-type silicon epitaxial layer;
    a semiconductor element formed in said N-type silicon epitaxial layer;
    a first metal electrode contacting said semiconductor element; and
    a second metal electrode directly contacting said rough surface of said N-type silicon substrate, said rough surface having an N-type impurity concentration, said N-type impurity concentration being substantially equal to said arsenic concentration, whereby an electric current flows in said semiconductor element in a direction of a thickness of said N-type semiconductor wafer between said first and second metal electrodes,
    wherein said rough surface is free from ion implantation.

33. A semiconductor device according to claim 32, wherein said N-type silicon substrate has a resistivity of less than 0.008 ohm·cm.

34. A semiconductor device according to claim 32, wherein said second metal electrode comprises a metal layer composed of at least one material selected from a group consisting of titanium (ti), vanadium (V), chromium (Cr) and nickel (Ni).

35. A semiconductor device according to claim 34, wherein said second metal electrode comprises a multilayer electrode composed of Ti—Ni—Au.

36. A semiconductor device according to claim 32, wherein a thickness from a surface of said first metal electrode to said rough surface of said N-type silicon substrate is 200–450 microns.

37. A semiconductor device according to claim 32, wherein said semiconductor element comprises a MOSFET formed in said N-type silicon epitaxial layer, said first metal electrode being a source electrode of said MOSFET, and said second metal electrode being a drain electrode of said MOSFET.

38. A semiconductor device according to claim 32, wherein said rough surface of said N-type silicon substrate has a surface roughness of between 0.2–0.6 microns.

39. A semiconductor device according to claim 32, wherein said rough surface of said N-type silicon substrate has a surface roughness of between 0.3–0.6 microns.

40. The semiconductor device of claim 32, wherein said second metal electrode is made of a metal layer containing titanium (Ti).

41. The semiconductor device of claim 32, wherein a thickness from a surface of said first metal electrode to said rough surface of said N-type silicon substrate is substantially 200 microns.

42. A semiconductor device according to claim 32, wherein the N-type silicon epitaxial layer includes phosphorus as an impurity.

43. A semiconductor device comprising:
    an N-type semiconductor wafer having an N-type silicon substrate with an arsenic concentration approximately between $7 \times 10^{18}$ and $1 \times 10^{21}$ cm$^{-3}$ and an N-type silicon epitaxial layer grown on said N-type silicon substrate, said N-type silicon substrate having an electrode contact surface opposite said N-type silicon epitaxial layer;
    a semiconductor element formed in said N-type silicon epitaxial layer;
    a first metal electrode contacting said semiconductor element; and
    a second metal electrode directly contacting said electrode contact surface, said electrode contact surface being a rough surface having an N-type impurity concentration, said N-type impurity concentration being substantially equal to said arsenic concentration of said N-type silicon substrate, said second metal electrode being made of a metal layer composed of at least one material selected from the group consisting of titanium (Ti), vanadium (V), chromium (Cr) and nickel (Ni), whereby an electric current flows in said semiconductor element in a direction of a thickness of said N-type semiconductor wafer between said first and second metal electrodes,
    wherein said electrode contact surface is free from ion implantation.

44. The semiconductor device of claim 43, wherein said second metal electrode is made of a metal layer containing titanium (Ti).

45. A semiconductor device according to claim 43, wherein the N-type silicon epitaxial layer includes phosphorus as an impurity.

46. A semiconductor device comprising:
    an N-type semiconductor wafer having an N-type silicon substrate with an arsenic concentration approximately between $7 \times 10^{18}$ and $1 \times 10^{21}$ cm$^{-3}$ and an N-type silicon epitaxial layer grown on said N-type silicon substrate, said N-type silicon substrate having a rough contact surface opposite said N-type silicon epitaxial layer;

a semiconductor element formed in said N-type silicon epitaxial layer;

a first metal electrode contacting said semiconductor element; and a second metal electrode directly contacting said rough contact surface of said N-type silicon substrate, said rough contact surface having an N-type impurity concentration, said N-type impurity concentration being substantially equal to said arsenic concentration and being free from ion implantation, whereby an electric current flows in said semiconductor element in a direction of a thickness of said N-type semiconductor wafer between said first and second metal electrodes.

47. The semiconductor device of claim 46, wherein said second metal electrode is made of a metal layer containing titanium (Ti).

48. A semiconductor device according to claim 46, wherein said second metal electrode is made of a metal layer composed of at least one material selected from a group consisting of titanium (Ti), vanadium (V), chromium (Cr) and nickel (Ni).

49. A semiconductor device according to claim 46, wherein the N-type silicon epitaxial layer includes phosphorus as an impurity.

50. A semiconductor device comprising:

an N-type semiconductor wafer having an N-type silicon substrate with an arsenic concentration approximately between $7\times10^{18}$ and $1\times10^{21}$ $cm^{-3}$ and an N-type silicon epitaxial layer grown on said N-type silicon substrate, said N-type silicon substrate having a rough surface opposite said N-type silicon epitaxial layer;

a semiconductor element formed in said N-type silicon epitaxial layer;

a first metal electrode contacting said semiconductor element; and a second metal electrode directly contacting said rough surface of said N-type silicon substrate, said rough surface having an N-type impurity concentration, said N-type impurity concentration being substantially provided with said arsenic concentration, whereby an electric current flows in said semiconductor element in a direction of a thickness of said N-type semiconductor wafer between said first and second metal electrodes, wherein said rough surface is free from ion implantation, whereby the impurity concentration of the rough surface is substantially provided with said arsenic concentration inherent in the N-type silicon substrate.

51. A semiconductor device according to claim 50, wherein said N-type silicon substrate has a resistivity of less than 0.008 ohm·cm.

52. A semiconductor device according to claim 50, wherein said second metal electrode comprises a metal layer composed of at least one material selected from a group consisting of titanium (Ti), vanadium (V), chromium (Cr) and nickel (Ni).

53. A semiconductor device according to claim 50, wherein a thickness from a surface of said first metal electrode to said rough surface of said N-type silicon substrate is 200–450 microns.

54. A semiconductor device according to claim 50, wherein said semiconductor element comprises a MOSFET formed in said N-type silicon epitaxial layer, said first metal electrode is a source electrode of said MOSFET, and said second metal electrode is a drain electrode of said MOSFET.

55. A semiconductor device according to claim 54, wherein said drain electrode comprises a multilayer electrode comprising Ti—Ni—Au.

56. A semiconductor device according to claim 50, wherein said rough surface of said N-type silicon substrate has a surface roughness of between 0.2–0.6 microns.

57. A semiconductor device according to claim 50, wherein said rough surface of said N-type silicon substrate has a surface roughness of between 0.3–0.6 microns.

58. A semiconductor device comprising:

an N-type semiconductor wafer having an N-type silicon substrate with an arsenic concentration approximately between $7\times10^{18}$ and $1\times10^{21}$ $cm^{-3}$ and an N-type silicon epitaxial layer grown on said N-type silicon substrate, said N-type silicon substrate having a rough surface opposite said N-type silicon epitaxial layer;

a semiconductor element formed in said N-type silicon epitaxial layer;

a first metal electrode contacting said semiconductor element; and a second metal electrode directly contacting said rough surface of said N-type silicon substrate, said rough surface having an N-type impurity concentration, said N-type impurity concentration being provided only with said arsenic concentration, whereby an electric current flows in said semiconductor element in a direction of a thickness of said N-type semiconductor wafer between said first and second metal electrodes.

59. A semiconductor device according to claim 58, wherein said N-type silicon substrate has a resistivity of less than 0.008 ohm·cm.

60. A semiconductor device according to claim 58, wherein said second metal electrode comprises a metal layer composed of at least one material selected from a group consisting of titanium (Ti), vanadium (V), chromium (Cr) and nickel (Ni).

61. A semiconductor device according to claim 58, wherein a thickness from a surface of said first metal electrode to said rough surface of said N-type silicon substrate is 200–450 microns.

62. A semiconductor device according to claim 58, wherein said semiconductor element comprises a MOSFET formed in said N-type silicon epitaxial layer, said first metal electrode is a source electrode of said MOSFET, and said second metal electrode is a drain electrode of said MOSFET.

63. A semiconductor device according to claim 62, wherein said drain electrode comprises a multilayer electrode comprising Ti—Ni—Au.

64. A semiconductor device according to claim 58, wherein said rough surface of said N-type silicon substrate has a surface roughness of between 0.2–0.6 microns.

65. A semiconductor device according to claim 58, wherein said rough surface of said N-type silicon substrate has a surface roughness of between 0.3–0.6 microns.

66. A semiconductor device according to claim 58, wherein said rough surface being free from ion implantation, whereby the impurity concentration of the rough surface being substantially provided only with said arsenic concentration inherent in the N-type silicon substrate.

67. A semiconductor device comprising:

an N-type semiconductor wafer having an N-type silicon substrate with an arsenic concentration approximately between $7\times10^{18}$ and $1\times10^{21}$ $cm^{-3}$ and an N-type silicon epitaxial layer grown on said N-type silicon substrate, said N-type silicon substrate having a rough surface opposite said N-type silicon epitaxial layer;

a semiconductor element formed in said N-type silicon epitaxial layer;

a first metal electrode contacting said semiconductor element; and a second metal electrode directly contacting said rough surface of said N-type silicon substrate, said rough surface having an N-type impurity concentration, said N-type impurity concentration being due substantially to said arsenic concentration, said rough surface having no ion implanted region, whereby an electric current flows in said semiconductor element in a direction of a thickness of said N-type semiconductor wafer between said first and second metal electrodes.

68. A semiconductor device according to claim 67, wherein said N-type silicon substrate has a resistivity of less than 0.008 ohm·cm.

69. A semiconductor device according to claim 67, wherein said second metal electrode comprises a metal layer composed of at least one material selected from a group consisting of titanium (Ti), vanadium (V), chromium (Cr) and nickel (Ni).

70. A semiconductor device according to claim 67, wherein a thickness from a surface of said first metal electrode to said rough surface of said N-type silicon substrate is 200–450 microns.

71. A semiconductor device according to claim 67, wherein said semiconductor element comprises a MOSFET formed in said N-type silicon epitaxial layer, said first metal electrode is a source electrode of said MOSFET, and said second metal electrode is a drain electrode of said MOSFET.

72. A semiconductor device according to claim 71, wherein said drain electrode comprises a multilayer electrode comprising Ti—Ni—Au.

73. A semiconductor device according to claim 67, wherein said rough surface of said N-type silicon substrate has a surface roughness of between 0.2–0.6 microns.

74. A semiconductor device according to claim 67, wherein said rough surface of said N-type silicon substrate has a surface roughness of between 0.3–0.6 microns.

75. A semiconductor device according to claim 67, wherein said rough surface being free from ion implantation, whereby the impurity concentration of the rough surface being due substantially to said arsenic concentration inherent in the N-type silicon substrate.

* * * * *